United States Patent
Ikeda

(10) Patent No.: US 10,935,937 B2
(45) Date of Patent: Mar. 2, 2021

(54) WORK ASSISTANCE DEVICE, WORK ASSISTANCE METHOD, AND WORK ASSISTANCE PROGRAM

(71) Applicant: FUJITSU LIMITED, Kawasaki (JP)

(72) Inventor: Hiroshi Ikeda, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 256 days.

(21) Appl. No.: 16/167,578

(22) Filed: Oct. 23, 2018

(65) Prior Publication Data
US 2019/0056701 A1 Feb. 21, 2019

Related U.S. Application Data

(63) Continuation of application No. PCT/JP2016/063055, filed on Apr. 26, 2016.

(51) Int. Cl.
*G05B 13/02* (2006.01)
*H05K 13/08* (2006.01)
(Continued)

(52) U.S. Cl.
CPC ..... *G05B 13/0255* (2013.01); *G05B 19/4188* (2013.01); *G05B 19/41845* (2013.01);
(Continued)

(58) Field of Classification Search
CPC ...... G06A 10/06; G06A 10/087; G06A 50/04; Y02P 90/30
See application file for complete search history.

(56) References Cited

U.S. PATENT DOCUMENTS 5,258,915 A * 11/1993 Billington ............ H05K 13/085
 700/103
5,479,343 A * 12/1995 Matoba .................. G06Q 10/06
 700/106

(Continued)

FOREIGN PATENT DOCUMENTS

JP 4-87762 3/1992
JP 2002-373015 12/2002
(Continued)

OTHER PUBLICATIONS

Ehsan Nazarian et al., "Design of multi-product manufacturing lines with the consideration of product change dependent inter-task times, reduced changeover and machine flexibility", Journal of Manufacturing Systems, Society of Manufacturing Engineers, US, vol. 29, No. 1, Jan. 1, 2010 (Jan. 1, 2010), pp. 35-46, XP027392116.

(Continued)

*Primary Examiner* — Santosh R Poudel
(74) *Attorney, Agent, or Firm* — Fujitsu Patent Center

(57) ABSTRACT

An apparatus for assisting a setup work in a system having lines for producing types of products, each of the lines requesting the setup work for producing the product after switching of the type of product, includes a processor to calculate an earliest time when the setup work for each product in each line becomes executable based on the production-plan information, and when a difference between the earliest time when the setup work for a first product in a first line becomes executable and the earliest time when the setup work for a second product in a second line other than the first line becomes executable is equal or greater than a predetermined threshold value, determines that the setup work for the first product is executed before the setup work for the second product, and determines an execution order of the setup work for each product using a problem solver.

5 Claims, 15 Drawing Sheets

(51) Int. Cl.
 *G06Q 50/04* (2012.01)
 *G06Q 10/06* (2012.01)
 *G05B 19/418* (2006.01)
(52) U.S. Cl.
 CPC . *G05B 19/41865* (2013.01); *G05B 19/41875* (2013.01); *G06Q 10/063* (2013.01); *G06Q 10/0631* (2013.01); *G06Q 50/04* (2013.01); *H05K 13/0857* (2018.08); *G05B 2219/32016* (2013.01); *G05B 2219/32263* (2013.01); *G05B 2219/32264* (2013.01); *Y02P 90/02* (2015.11); *Y02P 90/30* (2015.11)

(56) References Cited

U.S. PATENT DOCUMENTS

| | | | | |
|---|---|---|---|---|
| 2005/0228521 | A1* | 10/2005 | Nomoto | G06Q 10/04 700/97 |
| 2006/0015203 | A1* | 1/2006 | Fukushima | G06Q 10/06 700/100 |
| 2009/0118856 | A1 | 5/2009 | Nakagawa et al. | |
| 2009/0222123 | A1* | 9/2009 | Nevills | G06Q 10/06 700/104 |
| 2010/0249969 | A1* | 9/2010 | Durst | G05B 19/41865 700/100 |
| 2011/0130856 | A1* | 6/2011 | Fontanot | G06Q 10/06 700/100 |
| 2015/0039115 | A1* | 2/2015 | Sagara | H05K 13/0853 700/106 |
| 2016/0021803 | A1* | 1/2016 | Iwata | G06F 30/20 703/6 |
| 2017/0115659 | A1* | 4/2017 | Kothari | G06Q 10/20 |
| 2017/0318716 | A1* | 11/2017 | Pfaffinger | G05B 19/4097 |

FOREIGN PATENT DOCUMENTS

| | | | |
|---|---|---|---|
| JP | 2007148635 A * | 6/2007 | ............. Y02P 90/30 |
| JP | 2009-93278 | 4/2009 | |
| JP | 2009-217757 | 9/2009 | |
| JP | 2013-122733 | 6/2013 | |

OTHER PUBLICATIONS

Whitney P Duncan, "Methods for reducing changeover times through scheduling", Jan. 1, 2011 (Jan. 1, 2011), XP055568620, retrieved from the Internet:URL:https://digitalcommons.uri.edu/cgi/viewcontent. cgi?referer=&httpsredir=1&article=1093&context=theses, pp. 184.
EESR—Extended European Search Report of European Patent Application No. 16900384.5 dated Mar. 20, 2019.  Japanese references cited in the EESR were previously submitted in the IDS filed on Oct. 23, 2018..
International Search Report and Written Opinion of the International Searching Authority, mailed in connection with PCT/JP2016/063055 dated May 24, 2016 (8 pages), with partial English translation.

* cited by examiner

FIG. 5

<PRODUCTION PLAN INFORMATION DB 52>

| MOUNTER LINE | FIGURE NUMBER | SETUP TIME | PRODUCTION TIME |
|---|---|---|---|
| A | FIGURE NUMBER a | 00:20:00 | 01:20:00 |
| A | FIGURE NUMBER b | 00:15:00 | 03:05:00 |
| B | FIGURE NUMBER c | 00:05:00 | 01:30:00 |
| B | FIGURE NUMBER d | 00:05:00 | 00:50:00 |
| C | FIGURE NUMBER e | 00:15:00 | 01:40:00 |
| C | FIGURE NUMBER f | 00:15:00 | 00:30:00 |
| ⋮ | ⋮ | ⋮ | ⋮ |

FIG. 6

⟨PRODUCTION STATE INFORMATION DB 54⟩

| MOUNTER LINE | FIGURE NUMBER | SETUP START TIME | SETUP END TIME | PRODUCTION START TIME | PRODUCTION COMPLETION TIME |
|---|---|---|---|---|---|
| A | FIGURE NUMBER a | 08:00:00 | 08:23:00 | 08:23:00 | 09:52:00 |
| A | FIGURE NUMBER b | 09:52:00 | 10:07:00 | 10:07:00 | |
| B | FIGURE NUMBER c | 08:23:00 | 08:29:00 | 08:29:00 | |
| B | FIGURE NUMBER d | | | | |
| C | FIGURE NUMBER e | 08:49:00 | 09:04:00 | 09:04:00 | |
| C | FIGURE NUMBER f | | | | |
| ⋮ | ⋮ | ⋮ | ⋮ | ⋮ | ⋮ |

FIG. 7
(a)
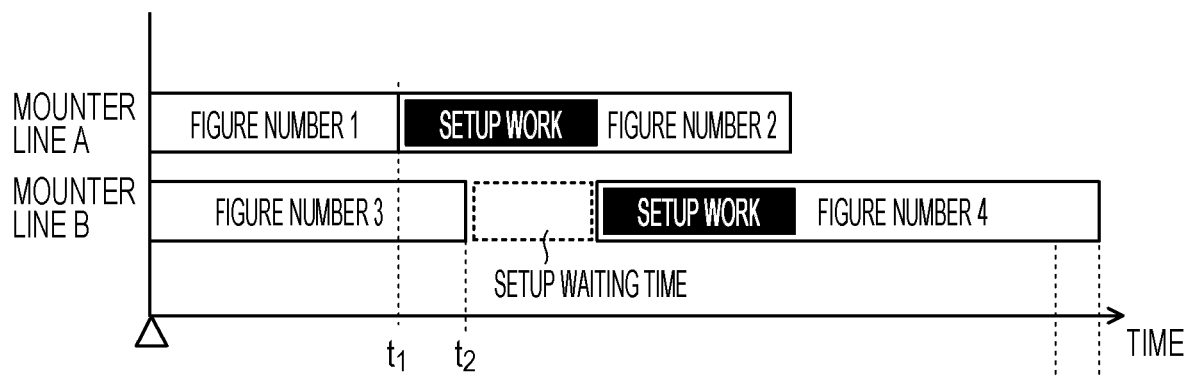
(b)
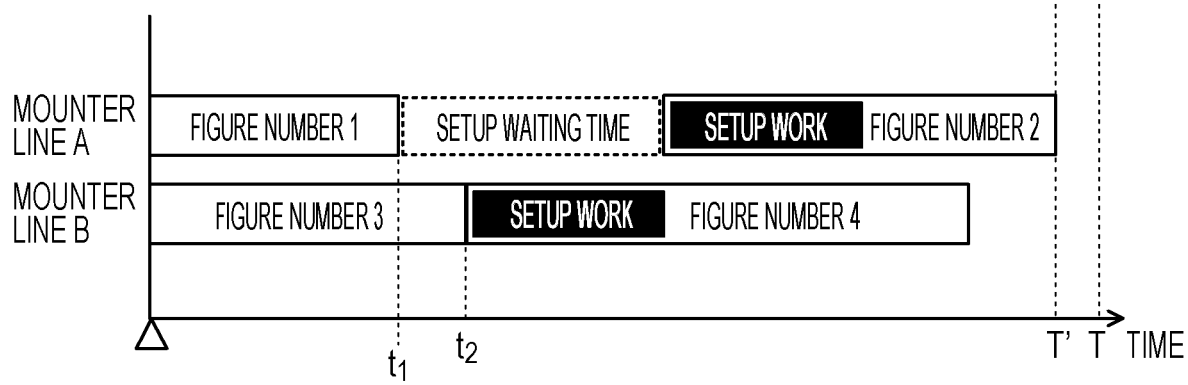

FIG. 9

| MOUNTER LINE | PRODUCTION COMPLETION TIME ESTIMATED VALUE AT LAST SATISFACTION OF TRIGGER CONDITION |
|---|---|
| A | 20:12:00 |
| B | 21:03:12 |
| C | 19:56:34 |
| ⋮ | ⋮ |

FIG. 13

| WORK ORDER | MOUNTER LINE | FIGURE NUMBER | SETUP START SCHEDULED TIME | SETUP END SCHEDULED TIME |
|---|---|---|---|---|
| 1 | B | FIGURE NUMBER d | 10:20:00 | 10:25:00 |
| 2 | C | FIGURE NUMBER f | 10:35:00 | 10:45:00 |
| ⋮ | ⋮ | ⋮ | ⋮ | ⋮ |

WORK ASSISTANCE DEVICE, WORK ASSISTANCE METHOD, AND WORK ASSISTANCE PROGRAM

CROSS-REFERENCE TO RELATED APPLICATION

This application is a continuation application of International Application PCT/JP2016/063055 filed on Apr. 26, 2016 and designated the U.S., the entire contents of which are incorporated herein by reference.

FIELD

The present invention relates to a work assistance device, a work assistance method, and a work assistance program.

BACKGROUND

In production lines such as surface mounting lines and various production apparatuses, preferably, a time when all production plans previously assigned to each production line or apparatus are completed (production completion time) is the earliest to the extent possible in terms of cost and deadline.

When small-lot production of a wide variety of products is performed in the production line or apparatus, the type of product (referred to as "figure number") often changes within a day. Accordingly, it is requested to change settings of the production line or apparatus (refer to Japanese Laid-open Patent Publication No. 2002-373015, Japanese Laid-open Patent Publication No. 4-87762, and Japanese Laid-open Patent Publication No. 2009-93278, for examples). Such setting change is referred to as "setup", and a work for setting change is referred to as "setup work". During the setup work, the production line or apparatus stops its production.

Often, one operator may take charge of the setup works for plurality of production lines or apparatuses. In this case, the operator may not simultaneously conduct the setup works for the plurality of production lines or the plurality of apparatuses. Conventionally, the operator conducts the setup works in the executable order of the setup work.

SUMMARY

From one aspect of the embodiments, a work assistance device for assisting a setup work in a system having a plurality of lines for producing plural types of products, each of the lines requesting the setup work for producing the product after switching of the type of product, includes a processor configured to acquire, among production plan information including setup time of each product, production time of each product, and a production order of the products in each line, production plan information on a product for which the setup work is yet to be performed, from a memory; formulate a problem of optimizing an execution order of the setup work as an integer programming problem based on the acquired production plan information and predetermined restrictions, and to determine the execution order of the setup work for each product using an integer programming problem solver; and calculate an earliest time when the setup work for each product in each line becomes executable based on the production plan information, and when a difference between the earliest time when the setup work for a first product in a first line becomes executable and the earliest time when the setup work for a second product in a second line other than the first line becomes executable is equal or greater than a predetermined threshold value, determines that the setup work for the first product is executed before the setup work for the second product, and then, determines the execution order of the setup work for each product using the integer programming problem solver.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 5 is a table illustrating an example of a data structure of a production plan information DB;

FIG. 6 is a table illustrating an example of a data structure of a production state information DB;

FIG. 7 is a graph for describing the effect of the execution order of the setup work on production completion time;

FIG. 9 is a table illustrating a production completion time estimated value for each mounter line;

FIG. 13 is a table illustrating an example of a display;

DESCRIPTION OF EMBODIMENTS

The production completion time may be advanced by devising the order of the setup work. However, devising the execution order of the setup work at a particular time affects the progress of production from this time onward. Accordingly, to determine the optimum execution order of the setup work, it is requested to solve a complicated optimization problem in consideration of future effect.

In the optimization problem, as the number of production lines or apparatuses increases, the number of combinations increases. Accordingly, it may take time for calculations, or a combinatorial explosion may occur to stop calculations.

From one aspect, an object of the present invention is to provide a work assistance device, a work assistance method, and a work assistance program that determine an appropriate execution order for the setup work with less computational complexity.

An embodiment of a production system will be described below with reference to FIGS. 1 to 14.

Figure 1:
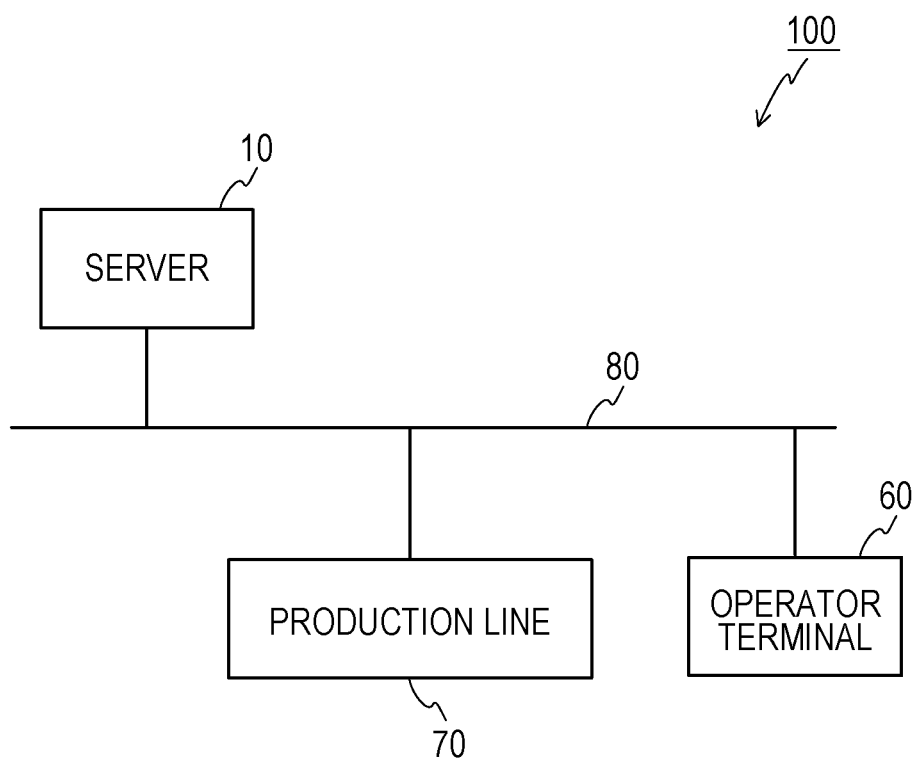
FIG. 1 is a view schematically illustrating a production system according to an embodiment.

FIG. 1 schematically illustrates a production system 100 according to an embodiment. As illustrated in FIG. 1, the production system 100 according to this embodiment includes a production line 70 as a system, a server 10 as a work assistance device, and an operator terminal 60. The production line 70, the server 10, and the operator terminal 60 are connected to a network 80.

Figure 2:
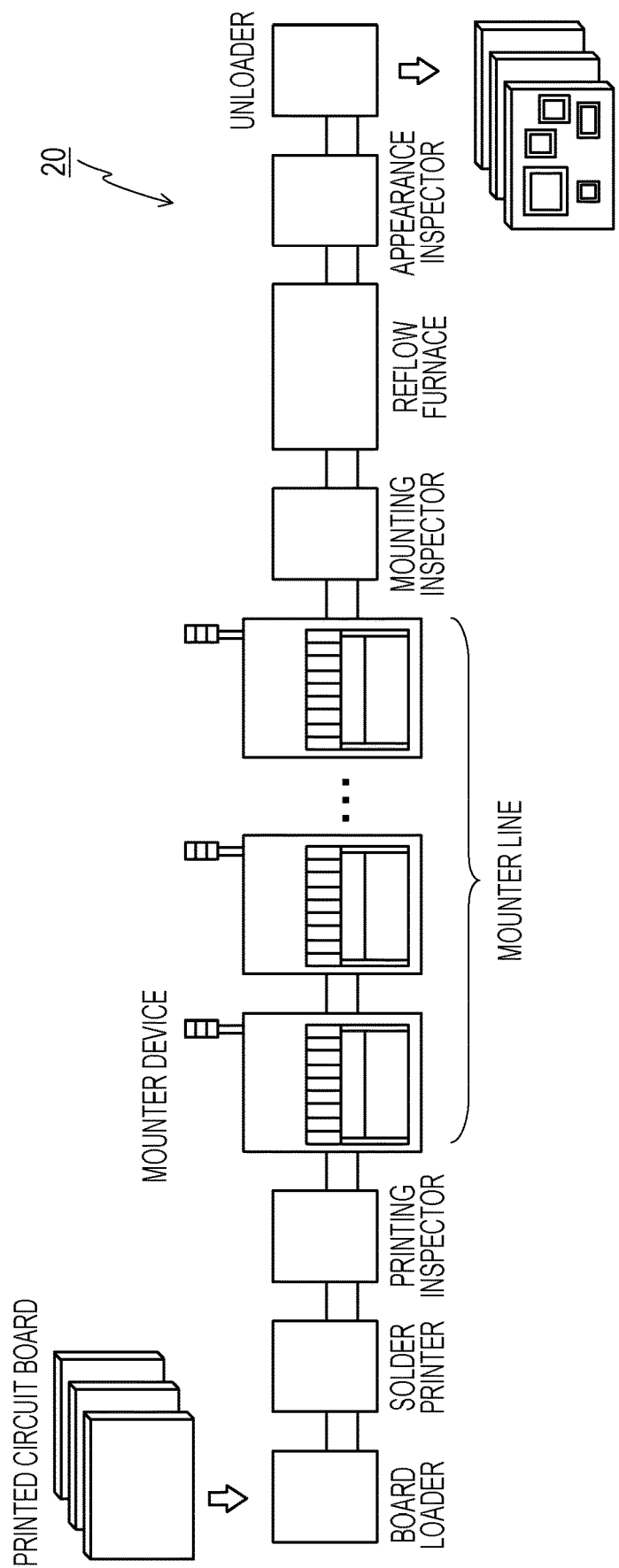
FIG. 2 is a view illustrating a surface mounting line.

As an example, the production line 70 has a plurality of surface mounting lines 20 as illustrated in FIG. 2. The surface mounting line 20 is a line for mounting components on a printed circuit board (hereinafter referred to as merely "board"), and includes a board loader, a soldering printer, a printing inspector, a mounter line, a mounting inspector, a reflow furnace, an appearance inspector, and an unloader. These devices are interconnected via a conveyor. The mounter line has a plurality of mounting devices for mounting components on the board.

The board loader loads the board on the conveyor. The soldering printer prints a solder at a predetermined position on the board. The printing inspector inspects the solder on the board. The board that has passed an inspection of the printing inspector is conveyed to the mounter line, and in the mounter line, each of the mounting devices surface-mounts a component such as an electronic component on the solder printed on the board. The mounting inspector inspects whether or not any fault exists in the mounting of the component on the board. The reflow furnace applies reflow to the board that has passed the inspection to fix the component to the board. The appearance inspector inspects whether or not any fault exists on the appearance of the board. The unloader takes the board that has passed the inspection out of the conveyor.

Each of the surface mounting line 20 of the production line 70 processes figure number according to the order predetermined at planning of production. Here, the "figure number" refers to a set (lot) of one or more identical boards consecutively manufactured in the same surface mounting line. According to this embodiment, it is assumed that the assignment of figure number to each surface mounting line 20 and the production order of the figure number may not be changed at the time of production.

According to this embodiment, a preparatory work is performed in a period between the production of one figure number and the production of next figure number. The preparatory work is referred to as "setup work", and a time taken for the setup work is referred to as "setup time". It is also assumed that, for each figure number, the setup time and the time taken to produce the figure number after setup (production time) is previously determined in a production plan. According to this embodiment, the setup work may not interrupt after start, or may be interrupted and restarted at the interrupted point.

In each of the surface mounting line 20, production is made based on the above-mentioned production plan. However, the timing of the setup work and the production time for each figure number may be achieved as planned. This is due to that when the setup works simultaneously occurs in the plurality of surface mounting line 20 handled by one operator, a time to start the setup work (waiting time) may be generated, or the production time varies because of a sudden stoppage of any device.

According to this embodiment, in describing optimization of the order of the setup work, processing time in the mounter line is used as the production time of each figure number. Accordingly, in a management database of the server 10, data on the production time is organized for each mounter line.

Returning to FIG. 1, the server 10 manages various data acquired from the production line 70, and notifies the production state of the production line 70 to the operator terminal 60. The server 10 notifies the order of the operator's setup work in the production line 70 to the operator terminal 60, thereby assisting the setup work of the operator.

Figure 3:
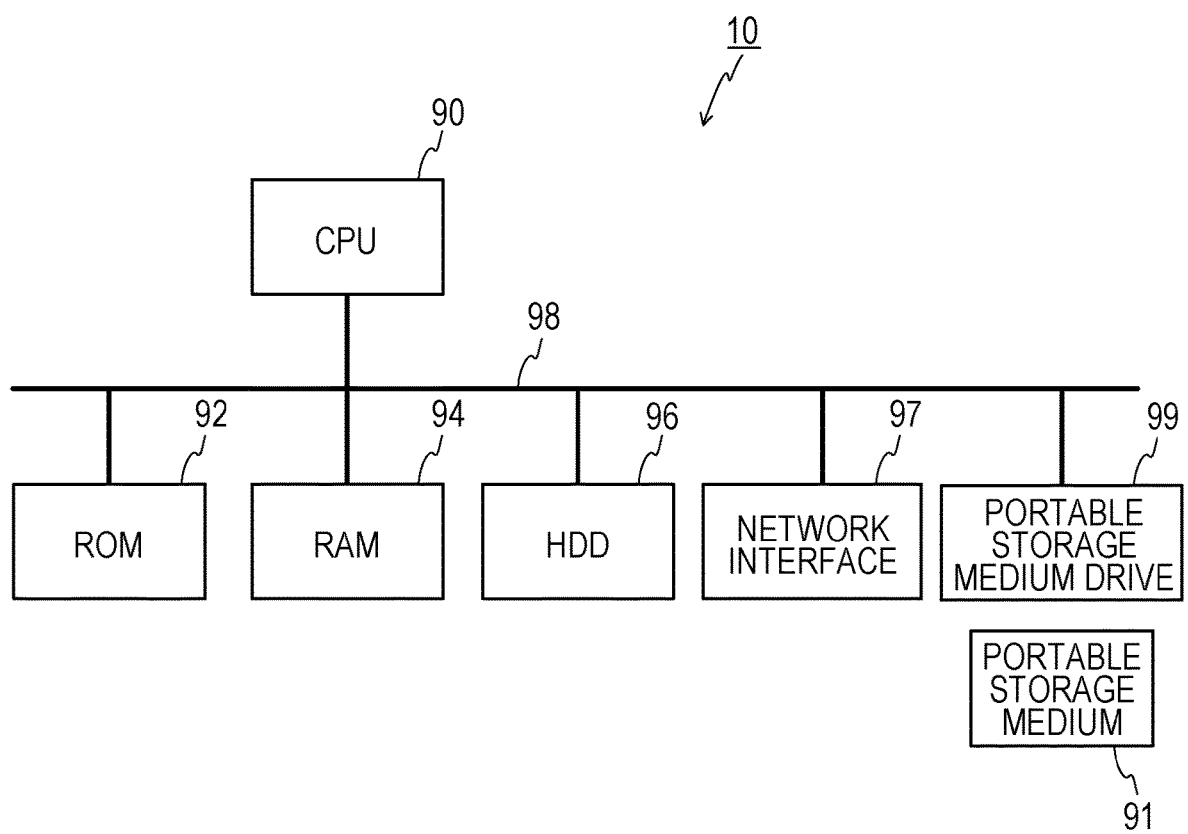
FIG. 3 is a view illustrating a hardware configuration of a server.
Figure 4:
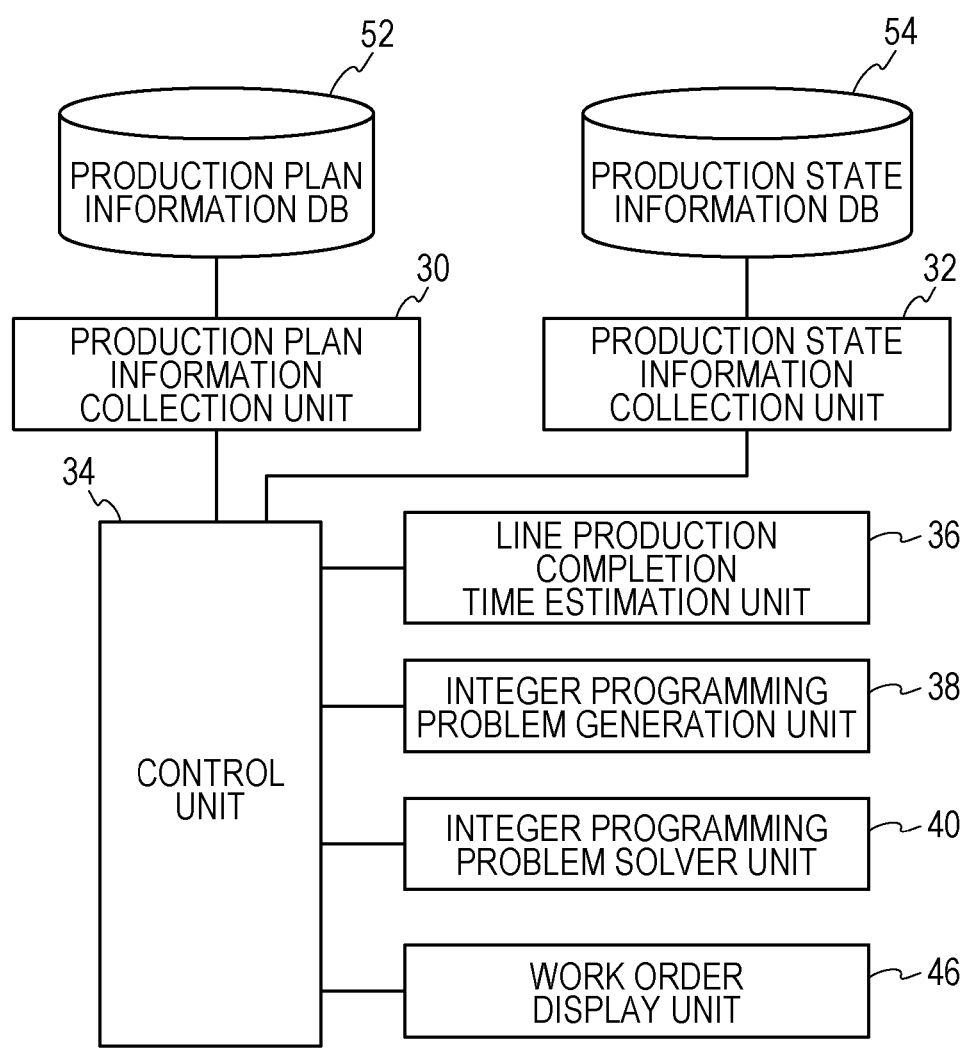
FIG. 4 is a functional block diagram of the server.

FIG. 3 illustrates a hardware configuration of the server 10. As illustrated in FIG. 3, the server 10 includes a CPU (Central Processing Unit) 90, a ROM (Read Only Memory) 92, a RAM (Random Access Memory) 94, a storage unit (here, an HDD (Hard Disk Drive)) 96 called as a memory, a network interface 97, and a portable storage medium drive 99. The constituents of the server 10 each are connected to a bus 98. In the server 10, the CPU 90 executes a program (including a work assistance program) stored in the ROM 92 or the HDD 96, or a program (including the work assistance program) read from the portable storage medium drive 99 by a portable storage medium 91, thereby performing functions of the constituents in FIG. 4. FIG. 4 also illustrate a production plan information DB (database) 52 and a production state information DB 54 which are stored in the HDD 96 or the like of the server 10.

FIG. 4 is a functional block diagram of the server 10. The CPU 90 executes the program, thereby functioning as a production plan information collection unit 30, a production state information collection unit 32, a control unit 34, a line production completion time estimation unit 36, an integer programming problem generation unit 38 as an acquisition unit, an integer programming problem solver unit 40, and a work order display unit 46 in FIG. 4.

The production plan information collection unit 30 collects production plan information from the production plan information DB 52, and transmits the collected production plan information to the control unit 34. The production plan information includes information on setup time and production time for each figure number.

FIG. 5 illustrates a specific data structure in the production plan information DB 52. As illustrated in FIG. 5, the production plan information DB 52 has fields: "mounter line", "figure number", "setup time", and "production time". The production plan information DB 52 stores which "figure number" is produced in which "mounter line" (surface mounting line 20). When a plurality of figure numbers produced in the same mounter line are present, the figure numbers are assumed to be produced in the order from top to bottom in the production plan information DB 52. The fields "setup time" and "production time" store time taken for setup and time taken for production, respectively, for each figure number. For example, the production plan information DB 52 stores that, in a mounter line A, figure number a and figure number b are produced in this order, setup time of 15 minutes is requested between the production of figure number a and the production of figure number b, and production times of figure numbers a, b are one four and 20 minutes, three hours and five minutes, respectively.

Returning to FIG. 4, the production state information collection unit 32 collects production state information from the production state information DB 54, and transmits collected production state information to the control unit 34. The production state information DB 54 manages information on the production state of each figure number.

FIG. 6 illustrates an example of a data structure in the production state information DB 54. As illustrated in FIG. 6, the production state information DB 54 has fields: "mounter line", "figure number", "setup start time", "setup end time", "production start time", and "production completion time". The production state information DB 54 stores "setup start time", "setup end time", "production start time", and "production completion time", as data acquired when any of "figure numbers" is produced in any of "mounter lines". For the figure number with production completed, all of the fields: "setup start time", "setup end time", "production start time", and "production completion time" store respective time. For the figure number with setup ended and production started, the fields: "setup start time", "setup end time", and "production start time" store respective time. For the figure number with setup started but not yet completed, the field "setup start time" store time. Time is not stored in all of the fields "setup start time", "setup end time", "production start time", and "production completion time", which represents the setup work has not started.

Returning to FIG. 4, the control unit 34 collectively controls each function (each unit) of the server 10. For example, the control unit 34 transmits the data collected by the production plan information collection unit 30 and the production state information collection unit 32 at appropriate timings to the units 36 to 40, and 46, or causes the units 36 to 40, 46 to execute processing at appropriate timings.

The line production completion time estimation unit 36 estimates a time when production of all figure number in each mounter line (surface mounting line 20) is completed, at a predetermined interval.

The integer programming problem generation unit 38 generates an integer programming problem solved by the integer programming problem solver unit 40. Specifically, the integer programming problem generation unit 38 determines variables, restrictions, and an objective function, and sets a part of the variable to a fixed value, to perform a countermeasure against combinatorial explosion in solving the integer programming problem.

The integer programming problem solver unit 40 solves the integer programming problem generated by the integer programming problem generation unit 38 by using software such as GLPK (GNU Linear Programming Kit). The integer programming problem solver unit 40 solves the integer programming problem to determine the work order of the setup work.

For example, as illustrated in FIG. 7, it is assumed that mounter lines A, B are present, the production end time of figure number 1 in the mounter line A is $t_1$, and the production end time of figure number 3 in the mounter line B is $t_2$. In this case, as illustrated in (a) of FIG. 7, when the setup work for the mounter line A is executed first, the setup work for the mounter line B may not be executed to generate a setup waiting time. In this case, as illustrated in (b) of FIG. 7, when the setup work for the mounter line B is executed first, the setup work for the mounter line A may not be executed to generate a setup waiting time. In this example, when the setup work for the mounter line A is executed first ((a) of FIG. 7), the production completion time in all lines becomes T, and when the setup work for the mounter line B is executed first ((b) of FIG. 7), the production completion time in all lines becomes T' (T' is earlier than T). That is, the integer programming problem solver unit 40 solves the integer programming problem, thereby determining the optimum order of the setup work such that the production completion time in all lines becomes the earliest to the extent possible.

The work order display unit 46 acquires a processing result (work order of the setup work) of the integer programming problem solver unit 40, and transmits the acquired processing result to the operator terminal 60, causing the operator terminal 60 to display the processing result.

Returning to FIG. 1, the operator terminal 60 is held by the operator or installed near the production line 70, and is a PC (Personal Computer), a tablet terminal, a smart phone or the like. The operator terminal 60 includes a display, and displays the work order of the setup work, which is determined by the server 10, to assist the operator's work.

(Processing of Server 10)

Processing of server 10 will be described below in detail with reference to flow charts in FIGS. 8, 10, and 11.

Figure 8:
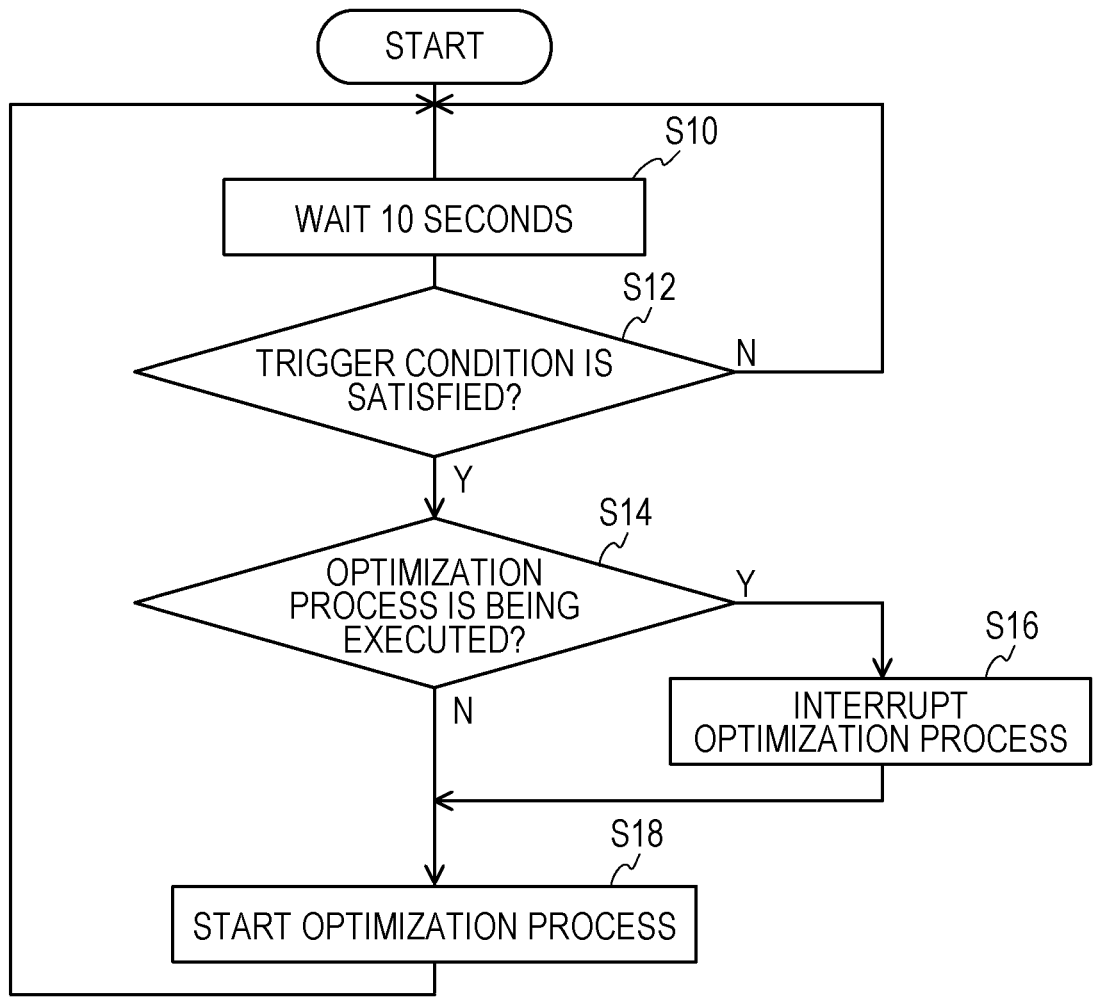
FIG. 8 is a flow chart illustrating processing executed by a control unit of a server.

(Processing in FIG. 8)

Figure 10:
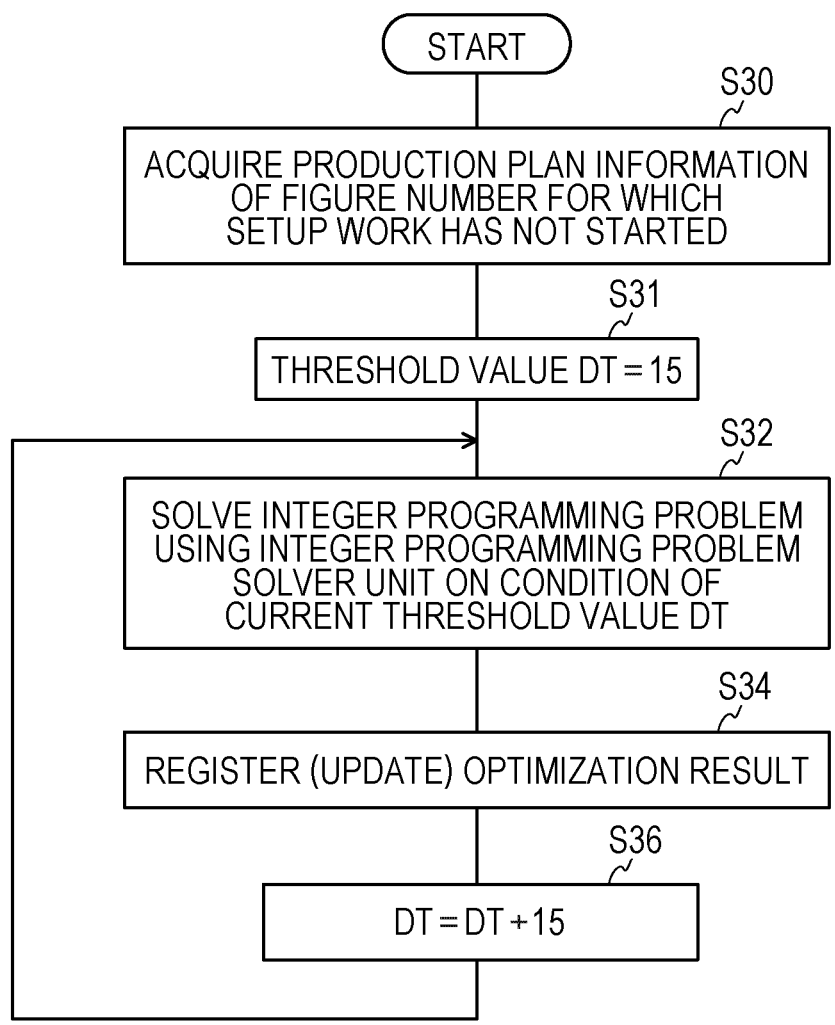
FIG. 10 is a flow chart illustrating processing executed by an integer programming problem generation unit and an integer programming problem solver unit.

The processing in FIG. 8 is processing of controlling timings of start and interruption of processing illustrated in FIG. 10. In the processing illustrated in FIG. 8, first, in Step S10, the control unit 34 waits for predetermined seconds (for example, 10 seconds). Next, in Step S12, the control unit 34 determines whether or not a trigger condition is satisfied. Here, if either of following conditions (1), (2) is satisfied, the control unit 34 determines that the trigger condition is satisfied. (1) A particular time (for example, 30 minutes) has elapsed since the trigger condition has been satisfied last time. (2) An absolute value $D_\alpha(=|T_\alpha'-T_\alpha|)$ that is a difference between an estimated value $T_\alpha$ of the production completion time in a mounter line $\alpha$ ($\alpha$=A, B, . . . ) at the time when the trigger condition has been satisfied last time, and an estimated value $T_\alpha'$ of the production completion time in the mounter line $\alpha$ at the current time is found, and in at least one mounter line $\alpha$, the absolute value becomes a particular value (for example, 10 minutes) or more.

The estimated value $T_i$ of the production completion time is estimated by the line production completion time estimation unit 36 at every timing at which Yes is selected in below-mentioned Step S12. Specifically, the line production completion time estimation unit 36 identifies figure number produced in a bottleneck process in each line, and estimates time taken to complete the production of the current figure number based on production history of the same figure number. The line production completion time estimation unit 36 also estimate time taken to complete the production of figure numbers produced from then on, based on the production plan information and production history of the same type of figure number. Then, the line production completion time estimation unit 36 adds time acquired by summing estimated time taken to complete the production of each figure number to the current time, thereby estimating the production completion time in each line. The estimated value of the production completion time is managed in a table as illustrated in FIG. 9 (internal table). Fields of "mounter line" and "production completion time estimated value at last satisfaction of trigger condition" are prepared in the table in FIG. 9.

Next, in Step S14, the control unit 34 determines whether or not an optimization process is being executed. The optimization process refers to processing according to a flow chart in FIG. 10. If Yes is selected in Step S14, the procedure proceeds to Step S16. When the procedure proceeds to Step S16, the control unit 34 interrupts the optimization process, and proceeds to Step S18. On the contrary, if No is selected in Step S14, the control unit 34 bypasses Step S16, and proceeds to Step S18.

When the procedure proceeds to Step S18, the control unit 34 starts the optimization process. In this case, the control unit 34 starts the processing according to the flow chart in FIG. 10. After that, the control unit 34 returns to Step S10, and repeats the above-described processing.

(Processing in FIG. 10 (Optimization Process))

Next, processing in FIG. 10 (optimization process) will be described. The processing in FIG. 10 is processing of determining an appropriate order of the setup work.

In the processing in FIG. 10, first, in Step S30, the integer programming problem generation unit 38 acquires the production plan information on figure number for which the setup work is not executed yet, from the production plan information DB 52 via the production plan information collection unit 30 and the control unit 34.

Next, in Step S31, the control unit 34 sets a threshold value DT to 15 (minutes) as an example.

Next, in Step S32, the integer programming problem solver unit 40 solves the integer programming problem on the condition of a current threshold value DT.

Here, as a precondition for processing of the integer programming problem solver unit 40 in Step S32, the integer programming problem generation unit 38 defines following variables, restrictions, and objective function as the integer programming problem. Figure number i (=1, 2, . . . , N) denotes figure number for which setup has not been started in Step S32, and does not include figure number for which setup has started or has completed.

(Variables)

$x_{ij}$: the order of $i^{th}$ figure number and $j^{th}$ figure number If i is earlier than j, 0, and if j is earlier than i, 1.
i=1 . . . N, j=1 . . . N, i≠j.
$ds_i$: setup start time of $i^{th}$ figure number
$de_i$: setup end time of $i^{th}$ figure number
$ms_i$: production start time of $i^{th}$ figure number
$me_i$: production end time of $i^{th}$ figure number
$D_i$: setup time of $i^{th}$ figure number
$M_i$: production time of $i^{th}$ figure number
$S_i$: temporary setup start time of $i^{th}$ figure number (Details will be described later)
$L_i$: figure number immediately preceding $i^{th}$ figure number in the same line (Restrictions)

∀i $ms_i=de_i$: relationship between setup end time and production start time of figure number ∀i $de_i=ds_i+D_i$: relationship between setup start time and setup end time of figure number ∀i $me_i=ms_i+M_i$: relationship between production start time and production end time of figure number ∀i $me_{ij} \leq ds_i$: relationship between production end time and setup start time of immediately preceding figure number combination of all figure numbers i, j in different production lines and i<j, $$ds_i \geq de_j - U \times (1-x_{ij}), ds_j \leq de_i - U \times x_{ij}$$

Setup time band ($ds_i$ to $de_i$) of all figure numbers do not overlap.

Wherein, U is sufficient larger than a sum of setup time and production time.

$$U \geq \Sigma_i (D_i + M_i)$$

∀i $ms_i \geq S_i$: relationship between temporary setup time S and setup start time (Objective Function)

∀i f≥$me_i$ minimization

A method of calculating the temporary setup start time $S_i$ of figure number i in the mounter line α, which is included in the above-mentioned variables, will be described below with reference to a flow chart in FIG. 11. Processing in FIG. 11 is processing executed each time the integer programming problem generation unit 38 generates the integer programming problem. Here, the temporary setup start time $S_i$ refers to the earliest time when the setup work for figure number i may be started (in the case of the setup waiting time of 0).

Figure 11:
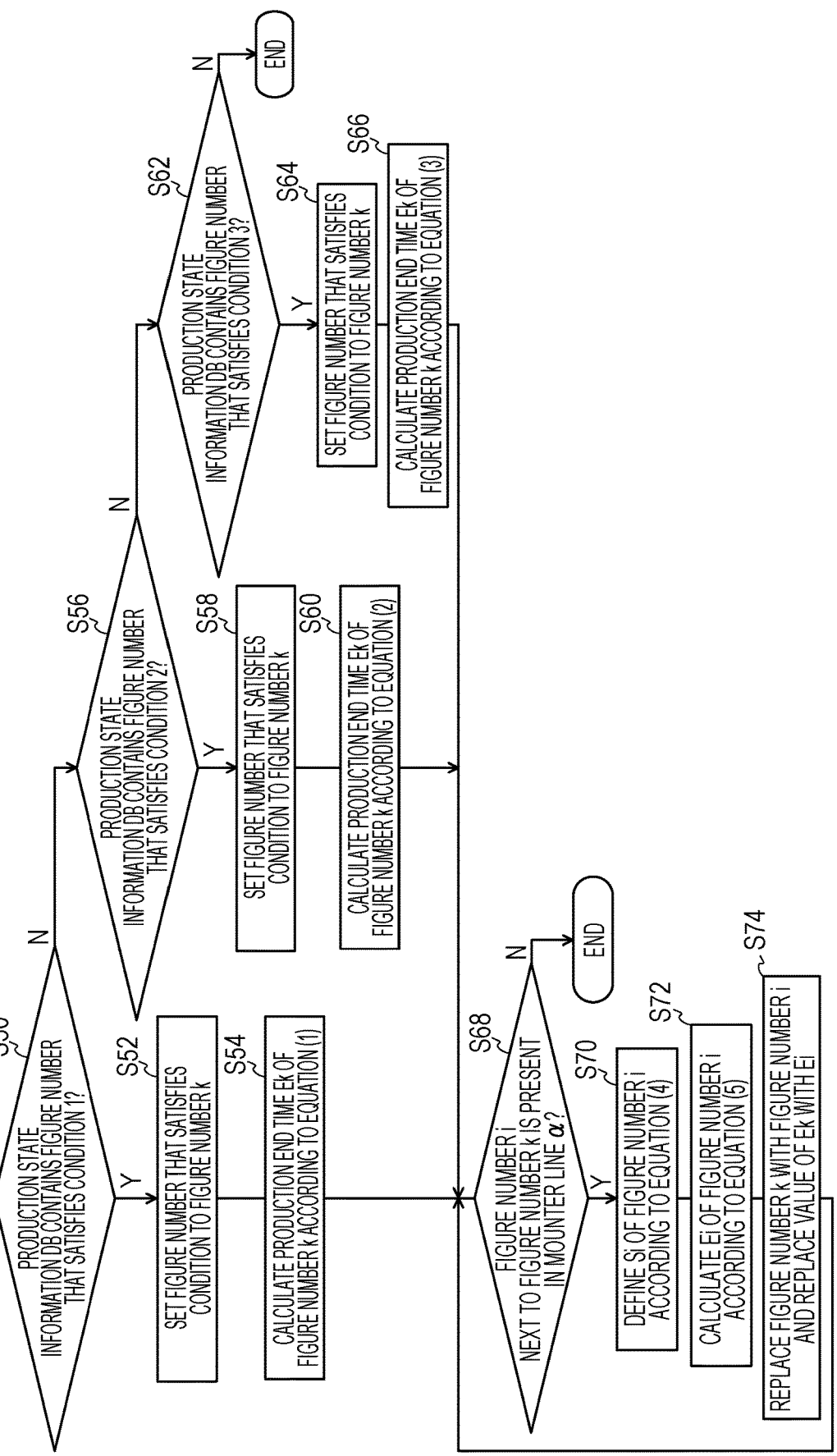
FIG. 11 is a flow chart illustrating processing of calculating temporary setup start time, which is executed by an integer programming problem generation unit.

In the processing in FIG. 11, first, in Step S50, the integer programming problem generation unit 38 determines whether or not the production state information DB 54(FIG. 6) contains figure number that satisfies a condition 1. Here, the condition 1 is that the figure number belongs to the mounter line α, its setup start time is recorded, and its setup end time is not recorded. If Yes is selected in Step S50, the procedure proceeds to Step S52, and the integer programming problem generation unit 38 sets the figure number that satisfies the condition to figure number k.

Next, in Step S54, the integer programming problem generation unit 38 calculates production end time $E_k$ of figure number k according to a following equation (1).

$E_k$=setup start time of figure number k+setup time of figure number k+production time of figure number k (1)

The setup start time of figure number k is acquired from the production state information DB 54, and the setup time of figure number k and the production time of figure number k are acquired from the production plan information DB 52.

When the processing in Step S54 is finished, the procedure proceeds to Step S68.

On the contrary, if No is selected in Step S50, the procedure proceeds to Step S56, and the integer programming problem generation unit 38 determines whether or not the production state information DB 54 contains figure number that satisfies a condition 2.

Here, the condition 2 is that the figure number belongs to the mounter line α, either its setup end time or production start time is recorded, and its production end time is not recorded.

If Yes is selected in Step S56, the procedure proceeds to Step S58, and the integer programming problem generation unit 38 sets the figure number that satisfies the condition to figure number k.

Then, in Step S60, the integer programming problem generation unit 38 calculates production end time $E_k$ of figure number k according to a following equation (2).

$E_k$=production start time of figure number k+production time of figure number k (2)

The production start time of figure number k is be acquired from the production state information DB 54, and the production time of the figure number k is acquired from the production plan information DB 52.

When the processing in Step S60 is finished, the procedure proceeds to Step S68.

On the contrary, if No is selected in Step S56, the procedure proceeds to Step S62, and the integer programming problem generation unit 38 determines whether or not the production state information DB 54 contains figure number that satisfies a condition 3.

Here, the condition 3 is that the figure number belongs to the mounter line α, and its recorded production end time is the latest.

If Yes is selected in Step S62, the procedure proceeds to Step S64, and the integer programming problem generation unit 38 sets the figure number that satisfies the condition to figure number k.

Then, in Step S66, the integer programming problem generation unit 38 calculates production end time $E_k$ of figure number k according to a following equation (3).

$E_k$=production end time of figure number k (3)

The production end time of figure number k is acquired from the production state information DB 54.

When processing in Step S66 is finished, the procedure proceeds to Step S68. On the contrary, if No is selected in Step S62, all processing in FIG. 11 is finished.

When proceeding to Step S68, the integer programming problem generation unit 38 determines whether or not figure number (figure number i) next to figure number k is present in mounter line α. If No is selected in Step S68, all processing in FIG. 11 is finished, and when Yes is selected, the procedure proceeds to Step S70.

When proceeding to the procedure proceeds to Step S70, the integer programming problem generation unit 38 defines temporary setup time $S_i$ of figure number i according to a following equation (4).

$$S_i = E_k \quad (4)$$

Next, in Step S72, the integer programming problem generation unit 38 calculates $E_i$ of figure number i according to a following equation (5).

$$E_i = S_i + \text{setup time of figure number } i + \text{production time of figure number } i \quad (5)$$

The setup time of figure number i and the production time of figure number i is acquired from the production plan information DB 52.

Next, in Step S74, the integer programming problem generation unit 38 replaces figure number k with figure number i to replace a value of $E_k$ with $E_i$.

Following Step S74, the integer programming problem generation unit 38 returns to Step S68, and repeats the processing and determination in Steps S68 to S74 until figure number next to figure number k in the mounter line a becomes absent. This may calculate the temporary setup work time $S_i$ of all setup works to be executed in the mounter line α.

The processing in FIG. 11 is performed for all mounter lines.

(Countermeasure Against Combinatorial Explosion)

In order to suppress combinatorial explosion occurring when the integer programming problem solver unit 40 solves the integer programming problem, the integer programming problem generation unit 38 sets at least some variables $x_{ij}$ to a fixed value ("0" or "1") using the temporary setup start time calculated in the processing in FIG. 11 and the threshold value DT. As described above, $x_{ij}$ are variables that indicate the order of $i^{th}$ figure number and $j^{th}$ figure number in different mounter lines. A method of setting some variables $x_{ij}$ to a fixed value will be described below.

If a difference between $S_i$ and $S_j$ ($=S_j-S_i$) of figure number i and figure number j that belong to different mounter lines is equal or greater than the threshold value DT (here, 15 minutes), the integer programming problem generation unit 38 fixes the setup order relationship between figure number i and figure number j to the order i→j. In this case, the variable $x_{ij}$ of the integer programming problem is fixed to 0.

On the contrary, if the difference between $S_i$ and $S_j$ ($=S_j-S_i$) of figure number i and figure number j that belong to different mounter lines is less than the threshold value DT, the integer programming problem generation unit 38 does not fix the setup order relationship between figure number i and figure number j (remains to be a variable).

Figure 12:
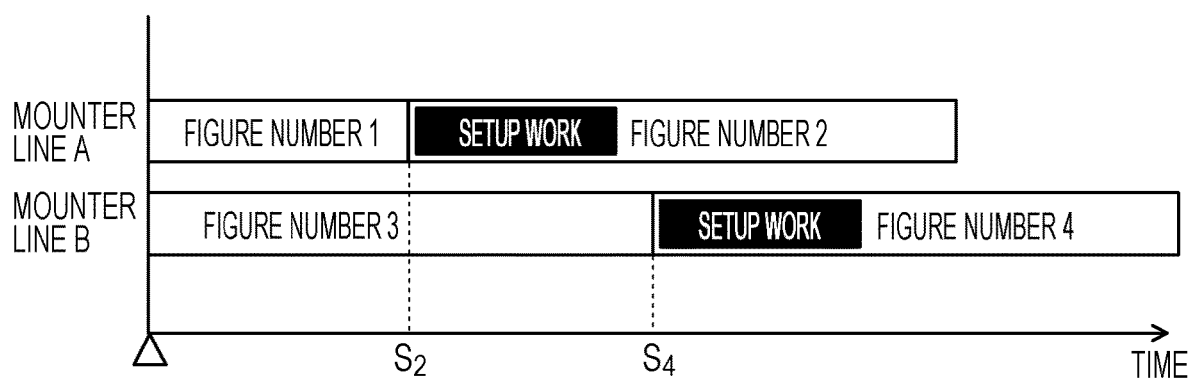
FIG. 12 is a graph for describing processing of setting variable $x_{ij}$ to a fixed value.

It is assumed that, as illustrated in FIG. 12, a difference between temporary setup work time $S_2$ of figure number 2 in mounter line A and temporary setup work time $S_4$ of figure number 4 in mounter line B is equal or greater than the threshold value DT (=15 minutes). In this case, variable $x_{24}$ is fixed to 0, and if the difference is less than the threshold value DT, variable $x_{24}$ remains to be a variable.

Some variables $x_{ij}$ may be set to a fixed value in this manner, reducing the number of variables. Thus, the number of combinations to be searched may be reduced to suppress the occurrence of combinatorial explosion.

Under the above-described combinatorial explosion countermeasure, the integer programming problem solver unit 40 uses GLPK or the like to solve the objective function based on the above-described variables and restrictions in Step S32 in FIG. 10. Thereby, the appropriate order of the setup work may be found less computational complexity.

Returning to FIG. 10, in Step S34, the integer programming problem solver unit 40 registers an optimization result in an internal memory. In this case, as an example, the optimization result of the execution order of the setup work as illustrated in FIG. 13 is registered in the internal memory. The optimization result in FIG. 13 stores "work order" that is the order of the setup work, information on "mounter line" and "figure number", and information on "setup start scheduled time" and "setup end scheduled time".

Next, in Step S36, the integer programming problem solver unit 40 adds a predetermined number (for example, 15 (minutes)) to current threshold value DT (DT=DT+15). After that, the integer programming problem solver unit 40 returns to Step S32, and executes Step S32 using a new threshold value DT. Then, in Step S34, the order of the setup work that registered in the internal memory is updated to the order found using the new threshold value DT (=30). Since the number of $x_{ij}$ set to a fixed value decreases as the threshold value is larger, more appropriate order of the setup work may be acquired irrespective of longer processing time. Accordingly, while the processing in FIG. 10 is executed, the internal memory is updated with the newly-acquired order of the setup work. As described above, according to this embodiment, the order of the setup work may be calculated more accurately by first setting a small threshold value to calculate the order of the setup work within a short time, and gradually increasing the threshold value if time permits. This may suppress the situation where processing time becomes too long and thus, the order of the setup work may not be notified to the operator as requested.

As described above, the processing in FIG. 10 is interrupted once when the trigger condition in FIG. 8 is satisfied. Then, after the satisfaction of the trigger condition, the internal memory that stores the order of the setup work is reset, and processing is restarted from Step S30. In this case, in Step S30, at the satisfaction of the trigger condition, the integer programming problem generation unit 38 newly acquires production plan information of figure numbers for which the setup work is yet to be performed, from the production plan information DB 52. Then, the integer programming problem generation unit 38 repeats the processing of formulating the integer programming problem based on the newly acquired production plan information, and determining the order of the setup work while gradually increasing the threshold value DT as described above.

The operator that performs the setup work may call information stored in the internal memory in FIG. 13 as appropriate (for example, when the setup work is requested), by use of the operator terminal 60. Thereby, the operator may perform the setup work according to the newest optimized order of the setup work.

According to this embodiment, the integer programming problem generation unit 38 and the integer programming problem solver unit 40 function as a determination unit that formulates, based on the production plan information and predetermined restrictions, a problem for optimizing the execution order of the setup work, as the integer programming problem, and determines the execution order of the setup work for each product using the integer programming problem solver.

As has been described in detail, according to this embodiment, the integer programming problem generation unit 38 acquires production plan information of figure number for which the setup work is yet to be performed, from the production plan information DB 52 (S30), and formulates a problem for optimizing the execution order of the setup work, based on the acquired production plan information and predetermined restrictions, as the integer programming problem (S32). Then, the integer programming problem solver unit 40 determines the execution order of the setup work for each figure number using the integer programming problem solver (GLPK or the like) (S32). In this case, the integer programming problem generation unit 38 calculates the temporary setup work start time $S_i$ of each figure number in each mounter line based on the production plan information (FIG. 11), and if the difference between $S_i$ of figure number i and $S_j$ of figure number j that belong to different mounter lines is equal or greater than the threshold value DT, sets the setup order relationship between figure number i and figure number j to the order i→j. Accordingly, according to this embodiment, the appropriate execution order of the setup work may be determined by formulating the integer programming problem based on the production plan information of figure number for which the setup work is yet to be performed, and solving the integer programming problem using the integer programming problem solver. In the integer programming problem, temporary setup work start time of each figure number is found, and if a difference between the temporary setup work start time and temporary setup work of figure number in a different mounter line is equal or greater than a threshold value, the order of the setup work for each figure number is fixed. This may decrease the number of variables used to solve the integer programming problem to suppress the occurrence of combinatorial explosion.

Figure 14:
FIG. 14 is a graph illustrating production completion time in a comparison example and production completion time according to an embodiment, respectively.

As a comparison example, (a) of FIG. 14 illustrates the setup time and the production time in the case where the setup work is performed in the order requested in mounter lines A to F as conventional. On the same production plan as in the comparison example ((a) of FIG. 14), (b) of FIG. 14 illustrate the setup time and the production time in the case where the order of the setup work is determined by solving the integer programming problem as in this embodiment. In (a) and (b) of FIG. 14, black rectangular portions represent the setup work, and white rectangular portions represent production.

As apparent from the comparison of (a) and (b) of FIG. 14, the production completion time in all mounter lines is advanced by solving the optimization problem to determine the order of the setup work as in this embodiment. In this example, this embodiment may reduce production time by 4% as compared with the comparison example.

According to this embodiment, the integer programming problem solver unit 40 increases the threshold value DT in stages (S36), repeats the processing of determining the execution order of the setup work, and updates the execution order at each repetition (S34). As described above, the setup work may be calculated and updated more accurately by first setting a small threshold value to calculate the order of the setup work within a short time, and gradually increasing the threshold value if time permits. This may suppress the situation where processing time becomes too long and thus, the order of the setup work may not be notified to the operator as requested.

According to this embodiment, every predetermined time or each time the production in each line deviates from the production plan by a predetermined value, the integer programming problem generation unit 38 acquires production plan information on figure number for which the setup work is yet to be performed, from the production plan information DB 52 (S30). The integer programming problem solver unit 40 resets an internal memory that stores the execution order of the setup work for each figure number, and determines the execution order of the setup work for each figure number. In this manner, the execution order of the setup work may be appropriately determined according to the production state of the mounter line.

In the above-described embodiment, the integer programming problem is repeatedly solved while sequentially changing the threshold value DT. However, when workload is not so large, a plurality of integer programming problems may be simultaneously solved using different threshold values DT in parallel.

In the above-described embodiment, when the operator requests to display the order of the setup work, the work order display unit 46 transmits the order of the setup work to the operator terminal 60 for display thereon. However, the present invention is not limited to this. For example, the work order display unit 46 may appropriately transmit the newest order of the setup work to the operator terminal 60 for display thereon.

Figure 15:
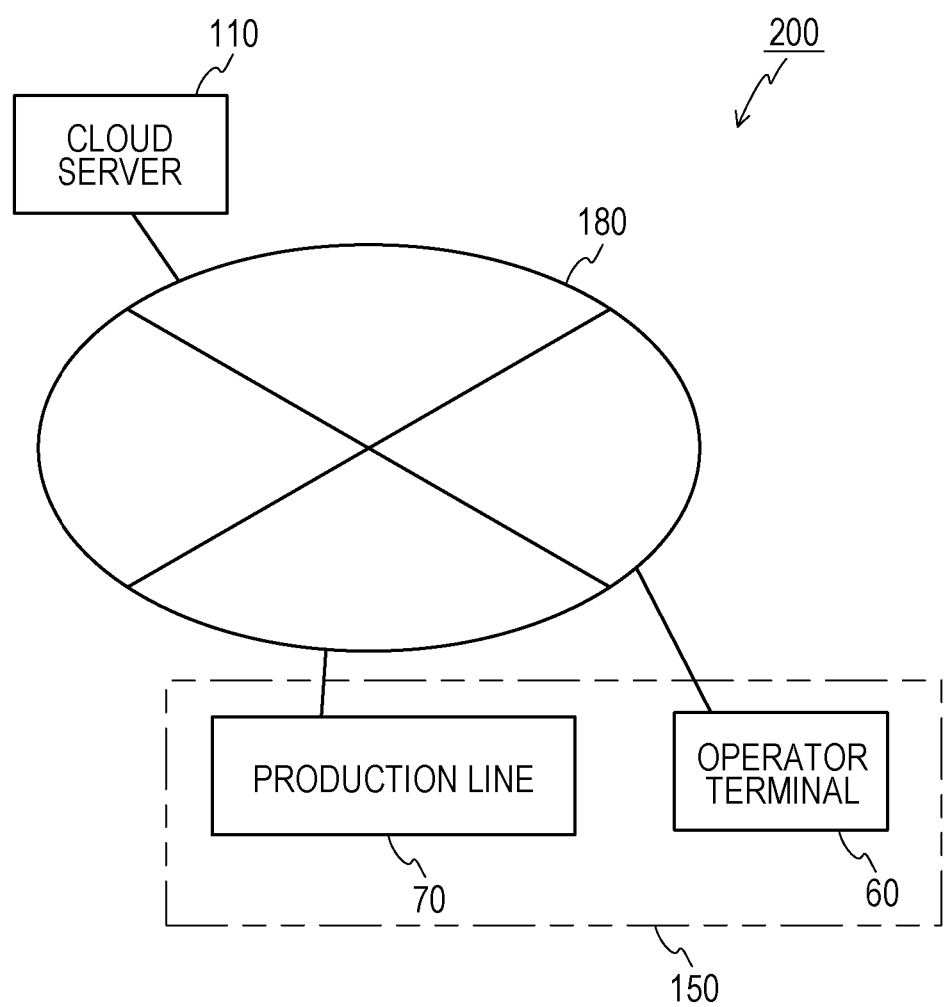
FIG. 15 is a view illustrating a modification example.

The server 10 may be an on-premise embodiment managed in a company or the like owning the production line 70 as in the above-described embodiment (FIG. 1), or may be a cloud server as in a production system 200 illustrated in FIG. 15. A cloud server 110 in FIG. 15 acquires data transmitted from the production line 70 in a factory 150 via a network 180, processes the data, and transmits a processing result to the operator terminal 60. The cloud server 110 and the factory 150 may be separately located in different countries.

The above-mentioned processing may be executed using a computer. In this case, a program that describes processing contents to be performed by functions of a processor is provided. The program is executed with the computer, such that the functions are implemented on the computer. The program that describes the processing contents may be recorded in a computer-readable recording medium (however, except for carrier wave).

To distribute the program, for example, the program is sold in the form of a portable recording medium such as DVD (Digital Versatile Disc) and CD-ROM (Compact Disc Read Only Memory) that records the program therein. The program may be stored in a storage device of a server computer, and the program may be transferred from the server computer to another computer.

The computer that executes the program stores the program recorded in a portable recording medium or the program transferred from the server computer in a storage device of its own. Then, the computer reads the program from the storage device of its own, and executes processing according to the program. The computer may also read the program directly from the portable recording medium, and execute processing according to the program. Each time the server computer transfers the program, the computer may execute processing according to the received program.

The above-described embodiment is a preferred embodiment of the present invention. However, the present invention is not limited to this embodiment, and may be variously modified within the subject matter of the present invention.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A work assistance device for assisting a setup work in a system having a plurality of lines for producing plural types of products, each of the lines requesting the setup work for producing a product after switching of a type of product, the work assistance device comprising:
   a memory; and
   a processor coupled to the memory, the processor configured to
      acquire, among production plan information including setup time of each product, production time of each product, and a production order of products in each line, production plan information on a product for which the setup work is yet to be performed, from the memory;
      formulate a problem of optimizing an execution order of the setup work as an integer programming problem based on the acquired production plan information and predetermined restrictions;
      determine the execution order of the setup work for each product using an integer programming problem solver;
      calculate an earliest time when the setup work for each product in each line becomes executable based on the production plan information; and
      when a difference between the earliest time when the setup work for a first product in a first line becomes executable and the earliest time when the setup work for a second product in a second line other than the first line becomes executable is equal or greater than a predetermined threshold value, determines that the setup work for the first product is executed before the setup work for the second product; and then,
   determines the execution order of the setup work for each product using the integer programming problem solver, wherein
   every predetermined time or each time production in the system deviates from the production plan information by a predetermined value or more,
   the processor acquires the production plan information on the product for which the setup work is yet to be performed, from the memory, and
   the processor resets the execution order of the setup work for each product, and restarts the processing of determining the execution order of the setup work for each product.

2. The work assistance device according to claim 1, wherein the processor repeats the processing of determining the execution order of the setup work for each product while increasing the threshold value in stages, and updates the execution order at each repetition.

3. A work assistance method of assisting a setup work in a system having a plurality of lines for producing plural types of products, each of the lines requesting the setup work for producing a product after switching of a type of product, the work assistance method causing a computer to execute a process, the process comprising:
   acquiring, among production plan information including setup time of each product, production time of each product, and a production order of products in each line, production plan information on a product for which the setup work is yet to be performed, from a memory; and
   formulating a problem of optimizing an execution order of the setup work as an integer programming problem based on the acquired production plan information and predetermined restrictions;
   determining the execution order of the setup work for each product using an integer programming problem solver, wherein
   in the determination processing, the earliest time when the setup work for each product in each line becomes executable based on the production plan information, and when a difference between the earliest time when the setup work for a first product in a first line becomes executable and the earliest time when the setup work for a second product in a second line other than the first line becomes executable is equal or greater than a predetermined threshold value, it is determined that the setup work for the first product is executed before the setup work for the second product, and then, the execution order of the setup work for each product is determined using the integer programming problem solver, wherein
   every predetermined time or each time production in the system deviates from the production plan information by a predetermined value or more,
   the production plan information on the product for which the setup work is yet to be performed is acquired from the memory, and
   the execution order of the setup work for each product is reset, and the execution order of the setup work for each product is restarted.

4. The work assistance method according to claim 3, wherein in the determination processing, the execution order of the setup work for each product is repeated while increasing the threshold value in stages, and the execution order is updated at each repetition.

5. A non-transitory computer-readable storage medium storing a program for assisting a setup work in a system having a plurality of lines for producing plural types of products, each of the lines requesting the setup work for producing a product after switching of a type of product, the work assistance method causing a computer to execute a process, the process comprising:
   acquiring, among production plan information including setup time of each product, production time of each product, and a production order of products in each line, production plan information on a product for which the setup work is yet to be performed, from a memory; and
   formulating a problem of optimizing an execution order of the setup work as an integer programming problem based on the acquired production plan information and predetermined restrictions;
   determining the execution order of the setup work for each product using an integer programming problem solver, wherein
   in the determination processing, the earliest time when the setup work for each product in each line becomes executable based on the production plan information, and when a difference between the earliest time when the setup work for a first product in a first line becomes executable and the earliest time when the setup work for a second product in a second line other than the first line becomes executable is equal or greater than a predetermined threshold value, it is determined that the setup work for the first product is executed before the setup work for the second product, and then, the execution order of the setup work for each product is determined using the integer programming problem solver, wherein every predetermined time or each time production in the system deviates from the production plan information by a predetermined value or more, the production plan information on the product for which the setup work is yet to be performed is acquired from the memory, and the execution order of the setup work for each product is reset, and the execution order of the setup work for each product is restarted.

\* \* \* \* \*